US011356069B2

(12) United States Patent
Watkins

(10) Patent No.: US 11,356,069 B2
(45) Date of Patent: Jun. 7, 2022

(54) DIGITAL POWER AMPLIFIER

(71) Applicant: Kabushiki Kaisha Toshiba, Minato-ku (JP)

(72) Inventor: Gavin Tomas Watkins, Bristol (GB)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 16/658,767

(22) Filed: Oct. 21, 2019

(65) Prior Publication Data
US 2021/0119587 A1  Apr. 22, 2021

(51) Int. Cl.
| | |
|---|---|
| *H03F 3/21* | (2006.01) |
| *H03F 1/32* | (2006.01) |
| *H01P 5/16* | (2006.01) |
| *H04B 1/04* | (2006.01) |
| *H04W 88/02* | (2009.01) |
| *H04W 88/08* | (2009.01) |

(52) U.S. Cl.
CPC .............. *H03F 3/211* (2013.01); *H01P 5/16* (2013.01); *H03F 1/3241* (2013.01); *H04B 1/0475* (2013.01); *H03F 2200/204* (2013.01); *H03F 2200/423* (2013.01); *H03F 2200/451* (2013.01); *H03F 2201/3215* (2013.01); *H03F 2203/21106* (2013.01); *H03F 2203/21139* (2013.01); *H03F 2203/21142* (2013.01); *H04B 2001/0408* (2013.01); *H04W 88/02* (2013.01); *H04W 88/08* (2013.01)

(58) Field of Classification Search
CPC ..................................................... H03F 3/211
See application file for complete search history.

(56) References Cited

U.S. PATENT DOCUMENTS

| | | | | |
|---|---|---|---|---|
| 9,912,303 | B2* | 3/2018 | Barton | ................... H03F 1/3241 |
| 2002/0136325 | A1* | 9/2002 | Pehlke | ................... H03F 1/0222 |
| | | | | 375/300 |
| 2004/0228422 | A1* | 11/2004 | Silveira | ................. H03F 1/3247 |
| | | | | 375/299 |
| 2009/0096525 | A1* | 4/2009 | Staszewski | ............. H03F 3/189 |
| | | | | 330/277 |

(Continued)

FOREIGN PATENT DOCUMENTS

| | | |
|---|---|---|
| EP | 3 035 526 A1 | 6/2016 |
| JP | 2012-114711 A | 6/2012 |

(Continued)

OTHER PUBLICATIONS

U.S. Appl. No. 16/176,684, filed Oct. 31, 2018, Gavin Tomas Watkins.

(Continued)

*Primary Examiner* — Patricia T Nguyen
(74) *Attorney, Agent, or Firm* — Oblon, McClelland, Maier & Neustadt, L.L.P.

(57) ABSTRACT

A digital power amplifier comprising at least two individually activatable amplifiers connected to an output network comprising a first hybrid coupler. An output of a first amplifier is connected to a first input of the first hybrid coupler and an output of a second amplifier is connected to a second input of the first hybrid coupler such that activating an amplifier of the at least two amplifiers causes the amplifier to load modulate another activated amplifier of at least two amplifiers.

15 Claims, 8 Drawing Sheets

(56) References Cited

U.S. PATENT DOCUMENTS

| | | | |
|---|---|---|---|
| 2010/0176885 A1* | 7/2010 | Kim | H03F 1/56 330/295 |
| 2010/0271121 A1* | 10/2010 | Jones | H03F 3/602 330/124 D |
| 2013/0122834 A1* | 5/2013 | Cabrera | H03F 1/3282 455/114.3 |
| 2014/0049318 A1* | 2/2014 | Goswami | H03F 1/0294 330/253 |
| 2014/0198880 A1* | 7/2014 | Borodulin | H03F 3/72 375/300 |
| 2014/0368274 A1 | 12/2014 | Kimura | |
| 2015/0048899 A1 | 2/2015 | Van Der Heijden | |
| 2015/0137885 A1 | 5/2015 | Kingsley | |
| 2015/0229272 A1* | 8/2015 | Hur | H03C 7/025 375/324 |
| 2015/0255219 A1 | 9/2015 | Schenk | |
| 2016/0056848 A1* | 2/2016 | Kiss | H04B 1/68 375/297 |
| 2016/0204970 A1 | 7/2016 | Hori | |
| 2016/0226450 A1 | 8/2016 | Ma et al. | |
| 2017/0070308 A1* | 3/2017 | Hahn, III | H03F 3/24 |
| 2017/0237407 A1 | 8/2017 | Babaie et al. | |
| 2017/0324381 A1 | 11/2017 | Qian et al. | |
| 2018/0019711 A1* | 1/2018 | Wang | H04B 1/0483 |
| 2018/0026583 A1* | 1/2018 | Yanduru | H03F 1/301 330/289 |
| 2019/0158047 A1 | 5/2019 | Watkins | |
| 2020/0266768 A1* | 8/2020 | Chen | H03F 3/211 |

FOREIGN PATENT DOCUMENTS

| | | |
|---|---|---|
| JP | 2012-235382 A | 11/2012 |
| TW | 201637356 A | 10/2016 |
| WO | WO 2018/132006 A1 | 7/2018 |

OTHER PUBLICATIONS

Tong Li, et al., "A Wideband Efficiency-Enhanced Class-G Digital Power Amplifier for IoT Applications", IEEE Microwave and Wireless Components Letters, vol. 28, No. 8, Aug. 2018, pp. 714-716.

Mohsen Hashemi, et al., "An Intrinsically Linear Wideband Polar Digital Power Amplifier", IEEE Journal of Solid-State Circuits, vol. 52, No. 12, Dec. 2017, pp. 3312-3328.

Sang-Min Yoo, et al., "A Power-Combined Switched-Capacitor Power Amplifier in 90nm CMOS", 2011 IEEE Radio Frequency Integrated Circuits Symposium, 2011, pp. 1-4.

Alireza Shirvani, et al., "A CMOS RF Power Amplifier With Parallel Amplification for Efficient Power Control", IEEE Journal of Solid-State Circuits, vol. 37, No. 6, Jun. 2002, pp. 684-693.

K. Motoi, et al., "Digital Doherty Transmitter with Envelope ΔΣ Modulated Class-D GaN Power Amplifier for 800 MHz band", 2014 IEEE MTT-S International Microwave Symposium (IMS2014), 2014, pp. 1-4.

* cited by examiner

DIGITAL POWER AMPLIFIER

FIELD

Embodiments described herein relate generally to digital power amplifiers and in particular to digital power amplifiers using load modulation.

BACKGROUND

Contemporary communications, broadcast and wireless standards like LTE, DVB/ISDB and 802.11ax, are based on orthogonal frequency division multiplexing (OFDM) modulation. Although OFDM is very spectrally efficient, it does so at the expense of a high peak-to-average power ratio (PAPR), which for the RF power amplifier (PA) in a transmitter equates to low average efficiency. It is likely that future, fifth generation (5G) standards will have an even greater PAPR, leading to even lower average operating efficiency.

Conventional single device RF PAs (i.e. class A, B, C, E, F and J) are capable of high efficiency only in their saturation region, i.e. peak output power ($P_{OUT}$). As $P_{OUT}$ is reduced, efficiency degrades. In know device the input power may be reduced to the amplifiers to allow accommodating the peaks without clipping them and causing distortion. This is referred to as "backing-off". Contemporary communications, broadcast and wireless connectivity standards require that on average, a PA operates at significant back-off to accommodate the large signal peaks. These peaks can often be 10 dB larger than the average $P_{OUT}$.

Arrangements of the present invention will be understood and appreciated more fully from the following detailed description, made by way of example only and taken in conjunction with drawings in which.

DETAILED DESCRIPTION

Figure 1:
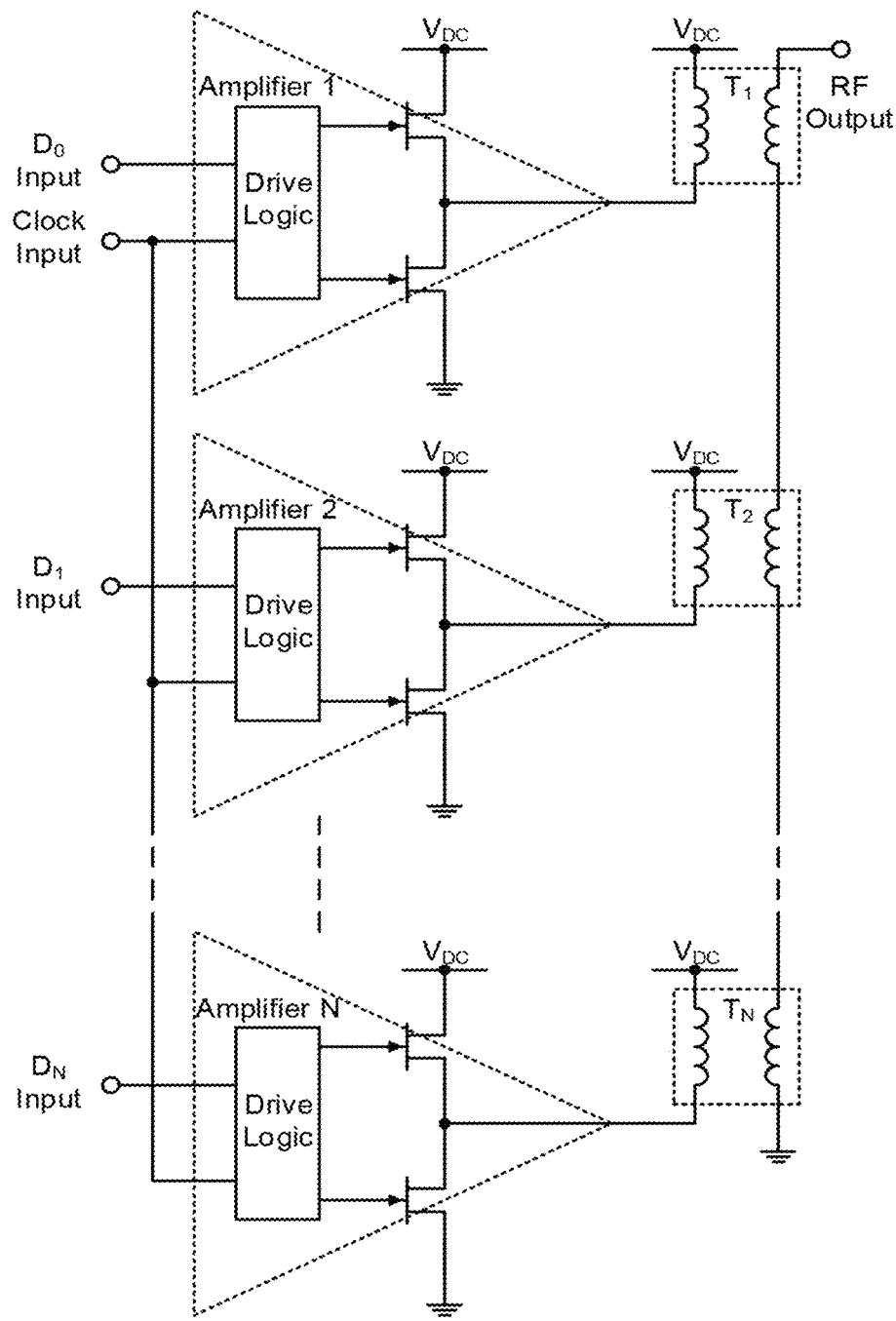
FIG. 1 shows a known Transformer Coupled Digital Power Amplifier (DPA)

According to an embodiment there is provided a digital power amplifier comprising at least two individually activatable amplifiers connected to an output network comprising a first hybrid coupler. An output of a first amplifier is connected to a first input of the first hybrid coupler and an output of a second amplifier is connected to a second input of the first hybrid coupler such that activating an amplifier of the at least two amplifiers causes the amplifier to load modulate another activated amplifier of at least two amplifiers.

In an embodiment each amplifier of the at least two individually activatable amplifiers comprises a transistor.

In an embodiment each amplifier of the at least two individually activatable amplifiers is enabled by applying a bias voltage to the input of transistor that is greater than or equal to the threshold voltage of the transistor.

In an embodiment each amplifier of the at least two individual activatable amplifiers is disabled by applying a large negative voltage to the input of the transistor.

According to an embodiment there is further provided a digital to analogue converter comprising the digital power amplifier as described herein.

In an embodiment the first power amplifier is a class D or a class E amplifier.

In an embodiment a shortest connection between an output of the digital power amplifier and the first amplifier comprises a single transmission line of the first hybrid combiner.

In an embodiment the output network comprises a second hybrid coupler and the second amplifier is connected to a first input of the second hybrid coupler and a third amplifier is connected to a second input of the second hybrid coupler. In the embodiment the first hybrid coupler and the second hybrid coupler have a common element and the first input of the second hybrid coupler is the same as the second input of the first hybrid coupler.

In an embodiment the common element is a common transmission line.

In an embodiment each hybrid coupler comprises four transmission lines and wherein the impedances of the transmission lines are altered from those of a standard hybrid coupler to enable said load modulation.

In an embodiment the impedances of transmission lines in the transmission line network are selected so that the impedance presented to a first activated amplifier by the combination of the output network and any other activated amplifiers sets the output power of the first activated amplifier so that the first activated amplifier operates in saturation.

In an embodiment the output power of an amplifier depends on a number of parallel hybrid combiners between the output of the amplifier and the output of digital power amplifier.

In an embodiment the second amplifier has a lower output power than the first amplifier.

In an embodiment the third amplifier has a lower output power than the second power amplifier.

In an embodiment the second amplifier has one hybrid combiner between the output of the second amplifier and the output of the digital power amplifier, wherein the third amplifier has two hybrid combiners between the output of the third power amplifier and the output of the digital power amplifier.

In an embodiment the amplifier with the shortest connection to the output is configured to provide the largest output power.

In an embodiment the amplifier separated from the output of the digital power amplifier by the largest number of hybrid combiners is configured to provide smallest output power.

In an embodiment the digital power amplifier has a number of output power states equal to 2 raised to the Nth power, where N equals a number of amplifiers in the at least two amplifiers.

In an embodiment the at least two amplifiers are enabled and disabled in sequence to produce the 2 raised to Nth power output power states.

In an embodiment the digital power amplifier is configured to receive digital signals for individually activating and deactivating the two or more amplifiers, said signals individually applied as gate bias to transistors of the amplifiers.

In an embodiment each amplifier of the at least two amplifier is configured to receive a digital signal of the digital signals and a radio frequency signal.

In an embodiment the digital signals represent a binary number.

In an embodiment the digital signal at the input to the first amplifier is the most significant bit of the binary number.

In an embodiment an amplifier of the at least two amplifiers comprises a series transmission line and a shunt transmission line between the output of the amplifier and the output network.

In an embodiment the series transmission line and the shunt transmission line are optimised for impedance matching and minimising the effect of harmonics.

In an embodiment an amplifier of the at least two amplifiers has a supply voltage that is different to another amplifier in the at least two amplifiers.

In an embodiment the two or more amplifiers are discrete devices.

In an embodiment the two or more amplifiers are different models/devices/componets.

In an embodiment the two or more amplifiers and their connections are configured to provide output power levels in saturation optimised for a predetermined signal modulation scheme.

In an embodiment an amplifier separated from the output of the digital power amplifier by the greatest number of hybrid combiners is a linear amplifier.

In an embodiment the digital power amplifier applies pre-distortion to the input of the amplifier.

In an embodiment the device is a mobile phone basestation or a DVB transmitter.

A number of techniques are known to increase power amplifier efficiency including: Doherty, Outphasing, Envelope Tracking (ET) and Dynamic Load Modulations (DLM). However these techniques have a high level of complexity and appear to have an efficiency cap when operating at back-off (i.e. below a power amplifiers saturation region).

In addition to the techniques described above, Digital Power Amplifiers (DPA) can also be used to achieve a highly efficient power amplifier. In DPA the gain and the phase of the output RF modulated signal are controlled by digital means. Where DPAs are employed in a transmitter, the DPA operates as the Digital to Analogue Converter (DAC). This is often referred to as a Radio Frequency Digital to Analogue Converter, or RFDAC.

FIG. 1 shows a prior art Transformer Coupled DPA. In FIG. 1 each amplifier (Amplifier 1, 2 . . . N) is fed at the input by a clock signal (Clock Input) at the Radio Frequency Carrier Frequency and a digital data input $D_0$ to $D_N$. The output of each amplifier in FIG. 1 is coupled to the winding of a transformer ($T_1, T_2 \ldots T_N$). Transformer Coupled DPA as shown in FIG. 1 are often realised in low power CMOS integrations using class D amplifiers.

In FIG. 1 a drive logic block in each amplifier combines the clock signal with the respective digital data inputs $D_0$ to $D_N$. If the data input to an amplifier is a logical high then the clock input signal will be passed from the input of the amplifier to the transistors in said amplifier, causing the transistors to switch on and off at the frequency of the clock input signal. This switching action induces a current that flows through the transformer's primary winding which is connected to the output of the amplifier, thereby producing a voltage across said transformers secondary winding.

In the architecture of FIG. 1 the induced voltage from each transformer (i.e. $T_1, T_2 \ldots T_N$) will add in series to produce an RF output that is representative of the input data. It is common for the digital input data to be encoded such that different inputs have different weightings to the overall value of the digital input. This situation is most common where the digital data input represents a binary number e.g. where $D_0$ represents the MSB of the binary data input while $D_N$ represents the LSB of said binary data input.

In this scenario it is possible to weight the transformers (using their turn ratios) such that different amplifiers contribute different voltages, in the on state, to the RF output. In order to create unequal contributions the transformers are usually binary weighted in their turn ratios. However, this approach can be problematic when a high digital resolution is required. As a result, some transformers in the power amplifier may have equal turns ratios and therefore multiple amplifiers may provide an equal contribution to the output signal even though the digital input signal represents a different contribution to the value of the input.

Figure 2:
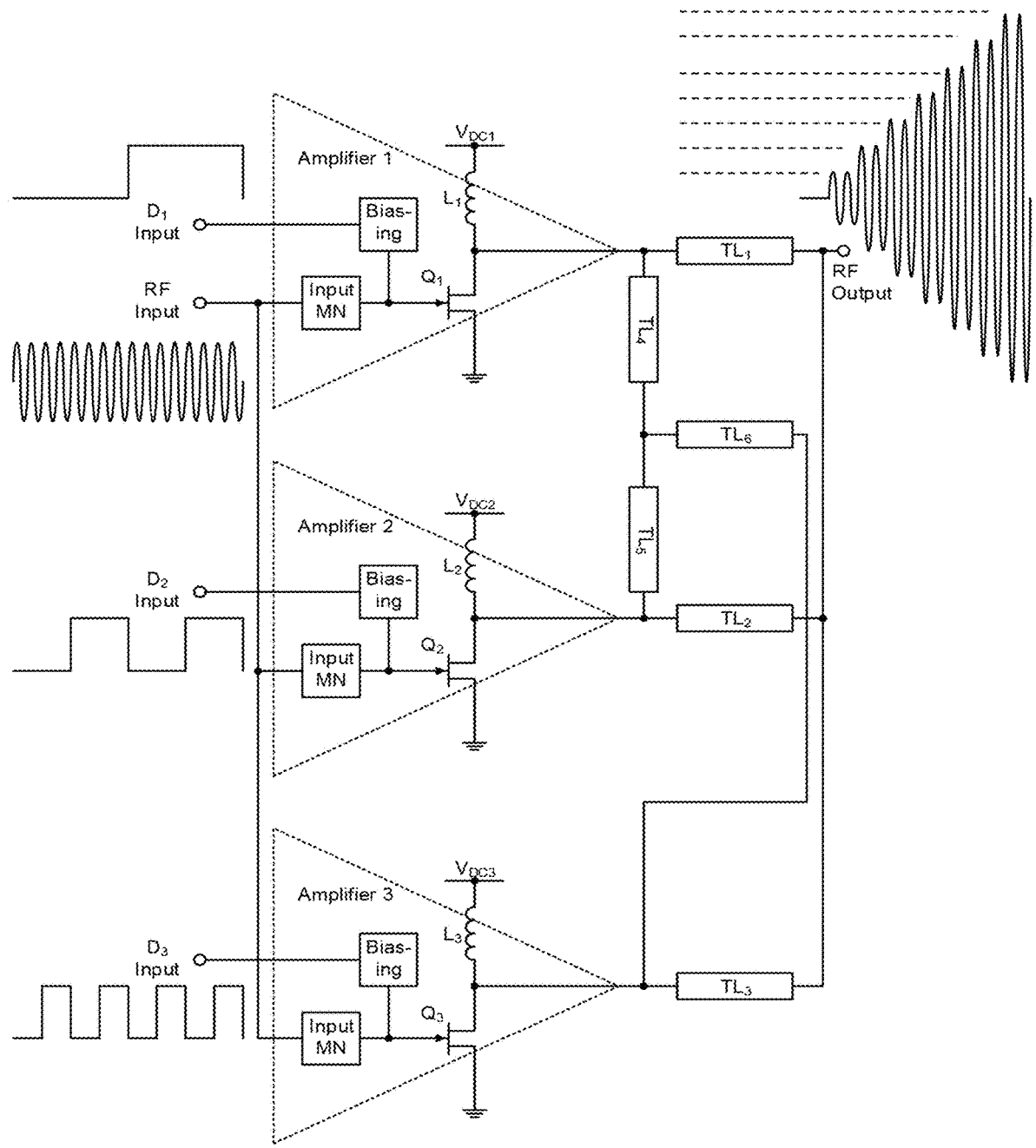
FIG. 2 shows a Digital Power Amplifier (DPA) with a rat-race combiner.

FIG. 2 shows a DPA with a rat-race combiner. FIG. 2 shows a DPA as described in U.S. Non-Provisional patent application Ser. No. 16/176,684 which is incorporated herein by reference.

In particular FIG. 2 shows an RF input that is applied to the input of Amplifier 1, Amplifier 2 and Amplifier 3. Each amplifier comprises an active device (e.g. $Q_1, Q_2, Q_3$). In this example each active device is a Field Effect Transistor (FET) device; however, a bipolar transistor or other form of active device may be used instead. Each active device ($Q_1, Q_2, Q_3$) has a gate that is driven by the RF signal and a biasing network. Optionally the gate is connected to the output of an input matching network (Input MN) for impedance matching of the input RF signal.

Each amplifier is enabled and disabled by controlling its gate bias. Applying a bias voltage just above the device's threshold will cause the transistor to amplify an RF signal applied to its input whereas applying a strong negative bias voltage will turn the transistor hard-off.

The biasing networks of each amplifier are connected to the respective input nodes through which they receive their respective digital input signal; $D_1$, $D_2$ or $D_3$. The digital input signal $D_1$, $D_2$ and $D_3$ are switching signals that turn Amplifiers 1, 2 and 3 on respectively when the signal is logically high and that turn Amplifiers 1, 2 and 3 off respectively when the signal is logically low. The biasing networks are configured to convert the respective input digital signals ($D_1$, $D_2$ and $D_3$) into a signal of appropriate voltage for switching the active devices on and off.

A first DC signal $V_{DC1}$ is supplied to a first inductor $L_1$, which in turn is connected to the drain of the active device $Q_1$. The first inductor $L_1$ is a high value inductor, or RF choke, which has a high impedance at the Radio Frequency (RF) operating frequency. The source of the active device $Q_1$ is connected to ground.

In the present case, an N-channel FET is used. Accordingly, when a low voltage is applied to the gate, the conductivity of the FET drops thereby increasing the voltage at the drain. Conversely, when a high voltage is applied to the gate, the conductivity of the FET increases, facilitating a larger current to flow through the FET. This causes the drain voltage towards to lower. The active device therefore amplifies the input signal by controlling the proportion of the supply voltage that is output at the drain. Amplifiers 2 and 3 are configured in a similar manner.

In FIG. 2 the six transmission line sections labelled as $TL_1$ to $TL_6$ form two rat-race combiners. Classic rat-race combiners consist of six transmission line sections, each a quarter wavelength in length and with a characteristic impedance of $\sqrt{2}\times$the characteristic impedance (e.g. 70.7Ω where the characteristic impedance is 50Ω). In the amplifier of FIG. 2 the dimensions of the six transmission lines $TL_1$ to $TL_6$ are not the same, but are optimised in length and impedance to create an asymmetric power combiner where one amplifier drives a different impedance than the others. Notably, in FIG. 2 the individual amplifier outputs are connected together via transmission lines of the rat-race combiners so that the amplifiers can load modulate each other.

FIG. 2 shows an output combining network based on three transmission line loops (rat-race combiners), where one loop is formed of $TL_1$, $TL_2$, $TL_4$ and $TL_5$, a second of $TL_1$, $TL_4$, $TL_3$ and $TL_6$ and a third of $TL_2$, $TL_3$, $TL_5$ and $TL_6$. It should be noted, that compared to the classic rat-race combiner, some of the transmission lines have been combined in FIG. 2 to enhance the clarity of the illustration.

In the Digital Power Amplifier of FIG. 2 there are two paths between each amplifier. A first path being via an output node and a second path being via another node. For example, in FIG. 2 the output of Amplifier 3 is connected to Amplifier 2 by two unique distinct paths. The first being via $TL_3$ and $TL_2$ in-between which is the output node and the second being via $TL_6$ and $TL_5$ in-between which is another node.

In one example of FIG. 2 the amplifiers operate in saturation. As a result, the voltage at the output of the Digital Power Amplifier will be constant for each amplifier, regardless of the impedance presented to that amplifier by the output transmission line network. As shown in FIG. 2, there are seven distinct output states, representing an amplified version of the seven distinct input states shown by the sequence of waveforms on inputs $D_1$ to $D_3$. In the case of FIG. 2, these 7 distinct output states represent the set of particular $P_{OUT}$s. Since the output voltage of each amplifier is the same when the amplifier is enabled or 'ON' due to the input provided on its respective port D, the only way to vary the output power is to vary the impedance presented to each transistor.

When multiple amplifiers drive a load, the impedance as seen from the amplifier will change, thereby changing the output currents. To correct for this the RF combining network provides the correct transformation such that the appropriate impedance is presented to the output of each amplifier to obtain a set of particular $P_{OUT}$s. The set of particular $P_{OUT}$s could for example follow the 6 dB steps size of a conventional DAC.

During the design process, optimisation algorithms are used to determine the dimensions of all of the transmission line sections used in the output network, based on the required $P_{OUT}$ for the plurality of output states (e.g. only Amplifier 1 ON; Amplifier 1 ON, Amplifier 2 ON, Amplifier 3 OFF; Amplifier 1 ON, Amplifier 2 OFF, Amplifier 3 ON; etc.) and an efficiency target. This process is described in U.S. Non-Provisional patent application Ser. No. 16/176,684 which is incorporated herein by reference. This optimisation process can generate a number of different combinations which enable the amplifiers to operate in saturation at the desired power rating.

Although in the above example the same supply voltage is provided to each amplifier it is noted that in other examples each amplifier could use a different supply voltage.

As shown in FIG. 2 the signal path comprising $TL_6$ has to crossover the signal path $TL_2$. This arrangement can be difficult to implement (on a printed circuit board for example) at radio frequencies due to the signal paths having to cross over. This is further exaggerated when scaling the amplifier arrangement to include more amplifiers for higher resolution output signals.

Figure 3:
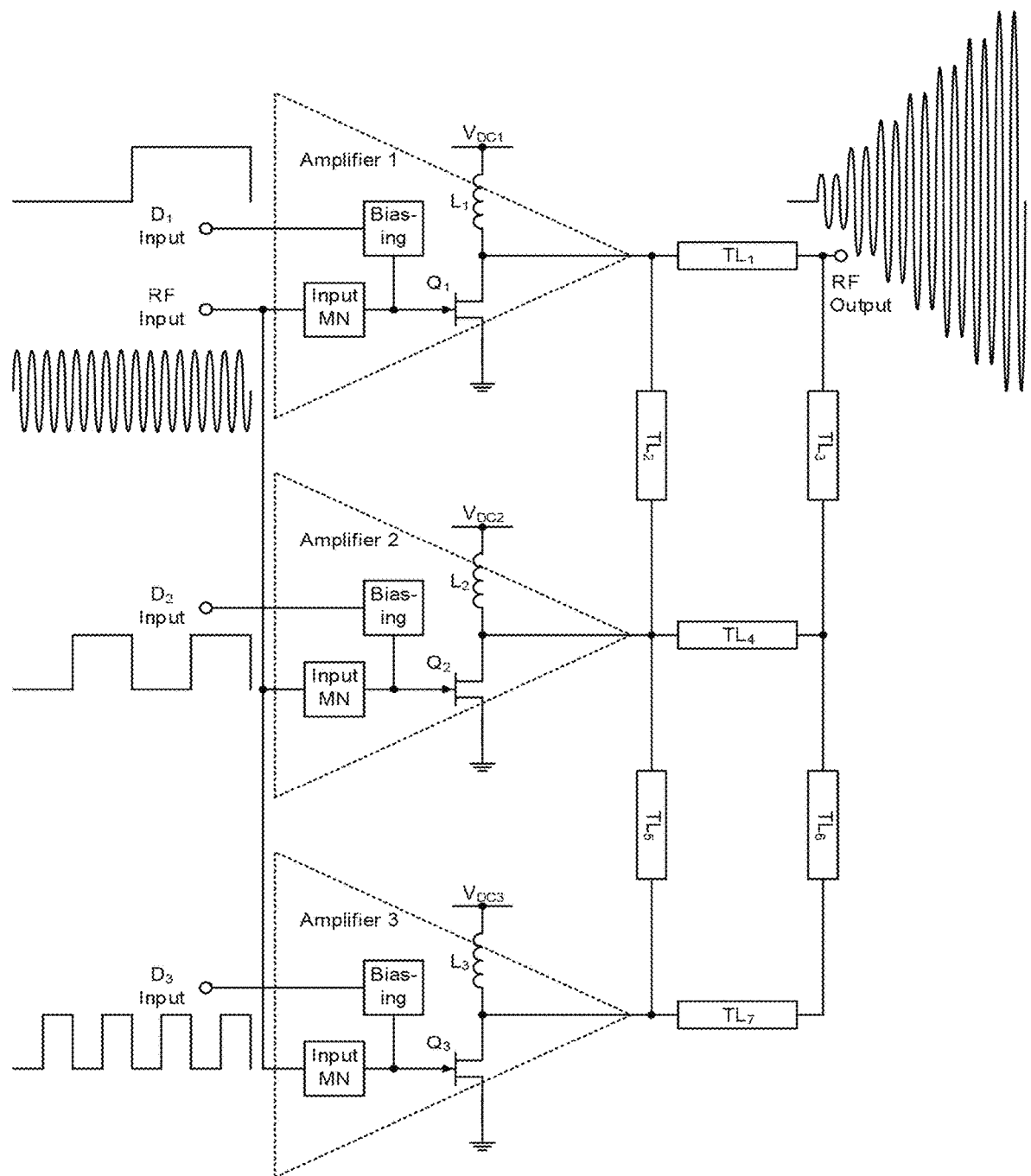
FIG. 3 shows a Digital Power Amplifier (DPA) with a hybrid combiner according to an embodiment.

FIG. 3 shows a DPA with a hybrid combiner according to an embodiment. Like the DPA in FIG. 2, FIG. 3 also exploits load modulation to achieve $2^N P_{OUT}$ states from N amplifiers. In an embodiment these amplifiers operate in a switching mode, for example in class D or E. However unlike the amplifier of FIG. 2, in FIG. 3 there is no common node between each of the amplifiers but rather each amplifier is connected in parallel to the next most powerful and the next least powerful amplifier.

For example, in FIG. 3 the amplifiers are stacked with only the most significant power amplifier (i.e. the power amplifier connected to the MSB of the digital input, in this case Amplifier 1) being connected to the output node (RF output), while the least significant power amplifier (i.e. the power amplifier connected to the LSB of the digital input; Amplifier 3) is furthest away from the output node. In an alternative embodiment the amplifiers do not have to be ordered in this fashion and may be in an arbitrary sequence.

In FIG. 3 the DPA uses hybrid couplers for the RF combining output network.

Figure 4:
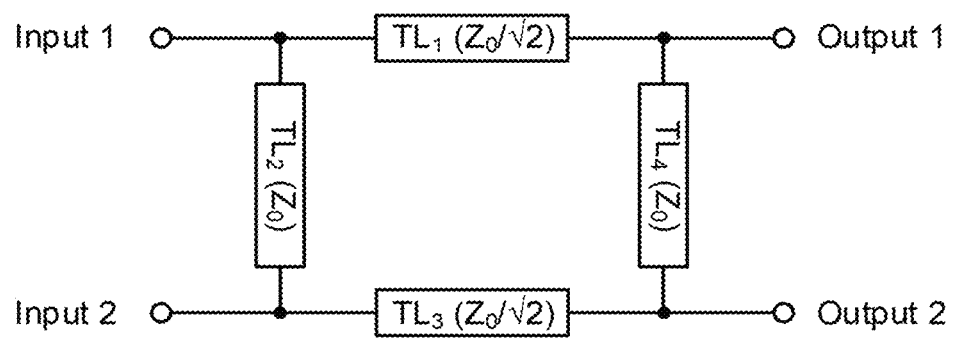
FIG. 4 shows an example of a classic hybrid coupler.

FIG. 4 shows an example of a classic hybrid coupler. FIG. 4 shows a hybrid coupler comprising four transmission line sections ($TL_1$, $TL_2$, $TL_3$ and $TL_4$) which are each a quarter of a wavelength long. Two of the transmission lines in the classic hybrid coupler have an impedance equal to the characteristic impedance of the system ($Z_0$), while the other two transmission lines have an impedance equal to the characteristic impedance divided by the square root of 2 ($Z_0/\sqrt{2}$). Optionally the characteristic impedance of the system is 50Ω. In use, any power incident on the input ports is split between the output ports depending on the phase relationship between the two inputs.

In FIG. 3 each amplifier can influence other amplifiers in DPA by a greater number of paths compared to the DPA using the rat-race combiner shown in FIG. 2. This introduces extra degrees of freedom and allows greater optimisation of the design process to meet the design targets of high efficiency for all of the $2^N P_{OUT}$ states.

The DPA shown in FIG. 3 operates in the same manner as that of FIG. 2. Namely, no current flows through the transistor when the transistor (i.e. the amplifier's active element) is disabled by applying a large negative bias on the gate input terminal. In this state the transistor will appear like a circuit composed of passive reactive components that will not dissipate any power on their own. When shunt and series transmission lines are connected between the amplifier's output and the RF output network (as will be discussed later in the description) an inactive transistor will appear as an imaginary impedance.

When the gate terminal of the active element (i.e. the transistor) is raised above the element's threshold voltage, any alternating signal applied to the gate (e.g. the RF Input) will cause an alternating current to flow between the drain and the source terminals. In this state the transistor is biased on. Optionally, the resulting current waveform is shaped by a series transmission line and a shunt transmission line coupled between the output of the amplifier and the transmission line network in order to increase efficiency. The waveform then continues to the RF output and generates a voltage across the applied load.

If more than one amplifier is biased on then the current injected by each amplifier into the transmission line network will combine in-phase to generate a larger voltage than either amplifier could achieve individually at the RF output.

Figure 5:
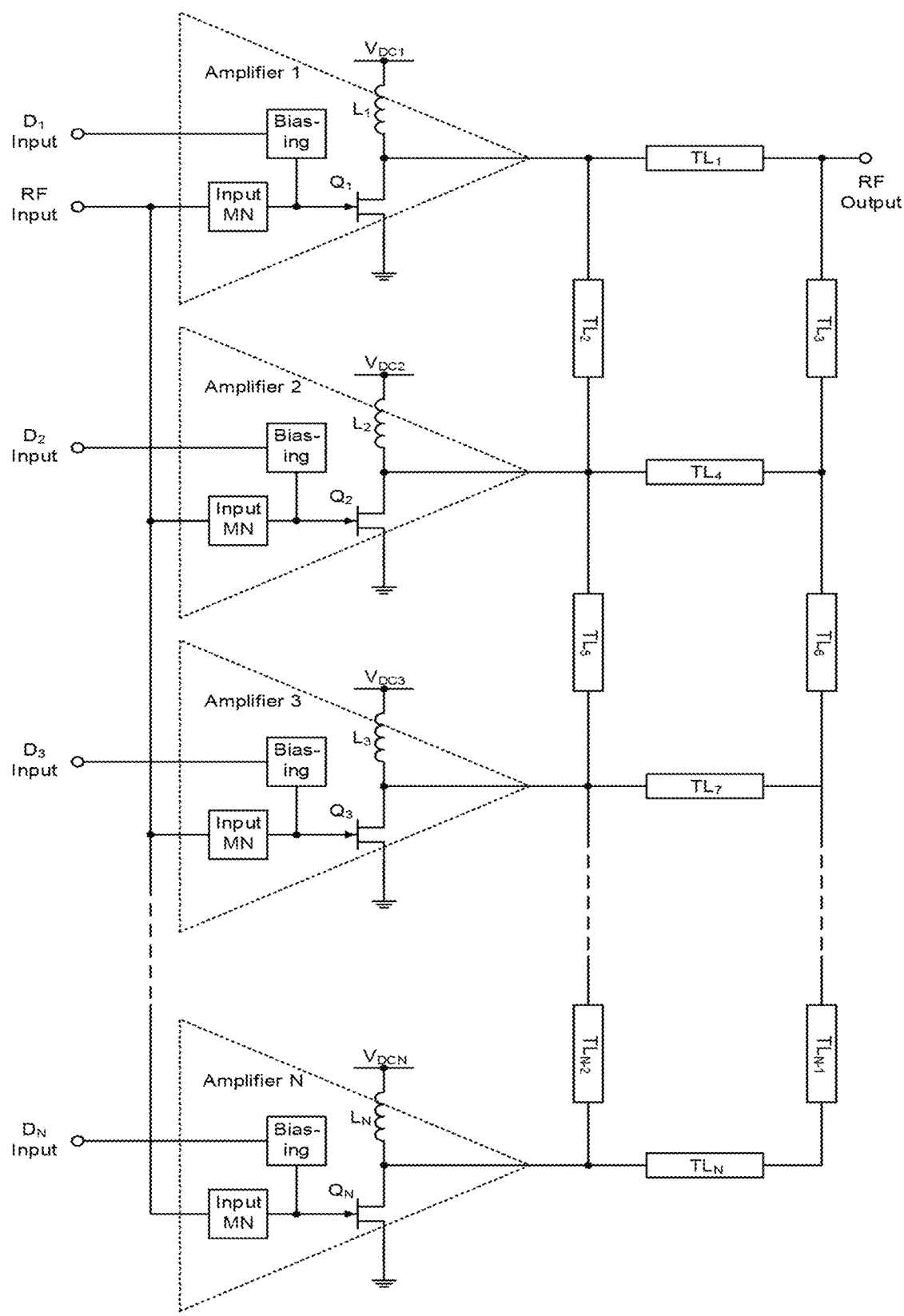
FIG. 5 shows the scalability of the Digital Power Amplifier (DPA) with a hybrid combiner according to an embodiment.

FIG. 5 shows the scalability of the DPA with a hybrid combiner according to an embodiment. FIG. 5 demonstrates how the DPA architecture of FIG. 3 is more scalable than that of FIG. 2. In FIG. 5 an extra amplifier (Amplifier N) is added to that shown in FIG. 3. Because of the arrangement (i.e. stacked amplifiers) extra amplifiers can be added to the DPA for a higher output resolution without substantially affecting the implementations (e.g. the layout).

Optionally, the additional amplifier (Amplifier N) has a smaller $P_{OUT}$ than amplifier 3 (i.e. the previous least-significant amplifier), thereby increasing the resolution without significantly increasing $P_{OUT}$.

Figure 6:
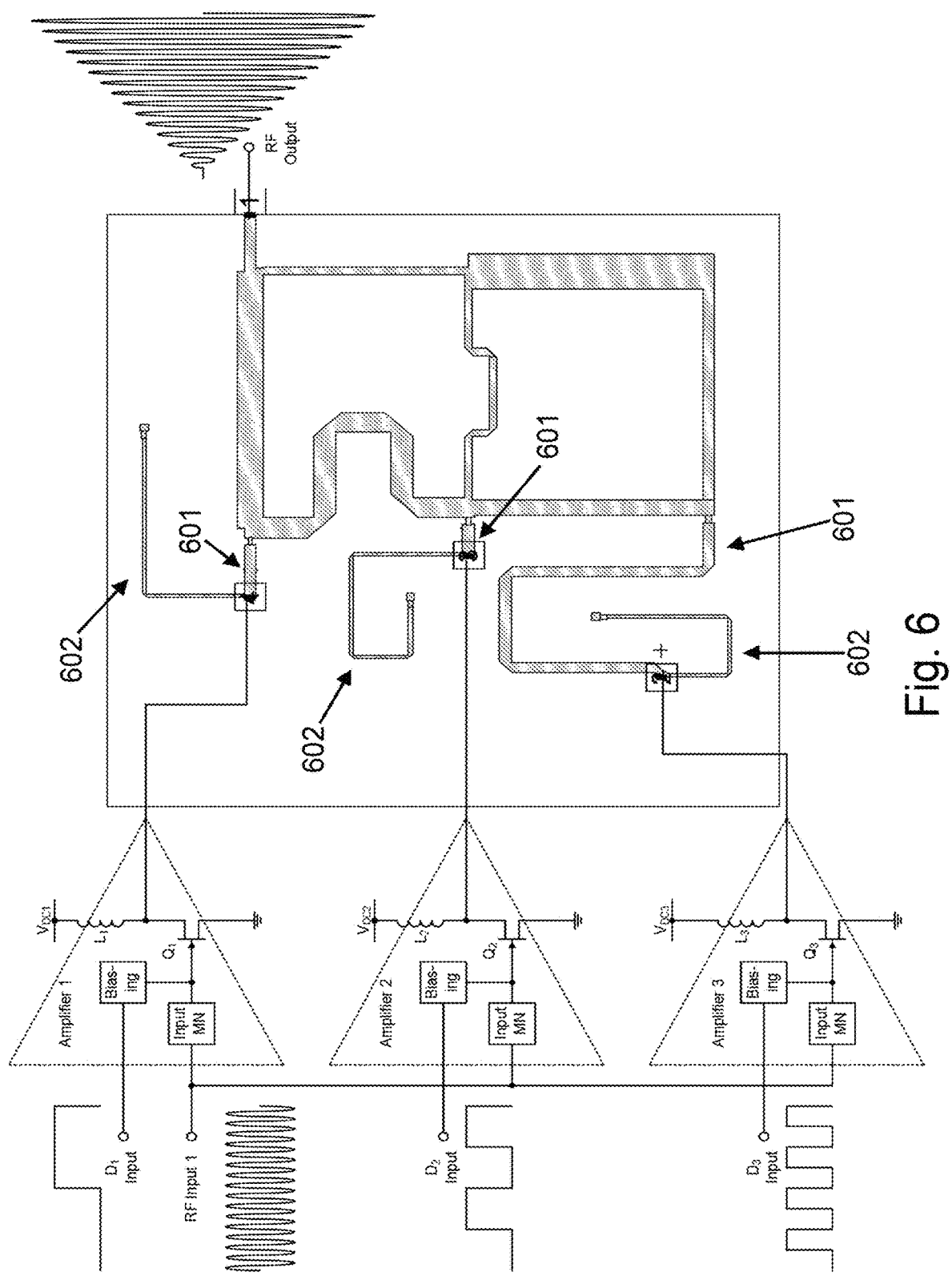
FIG. 6 shows an implementation of an optimised hybrid combiner for a Digital Power Amplifier (DPA) according to an embodiment.

FIG. 6 shows an implementation of an optimised hybrid combiner for a DPA according to an embodiment. Although the hybrid combiner shown in FIG. 4 is the starting point, an optimisation algorithm is used to determining the optimum length and width of the transmission line sections to achieve the required $P_{OUT}$ states and efficiencies. Due to optimisation the transmission line sections differ from the classical hybrid coupler as can be seen from the different length and widths of the transmission lines ($TL_{1-6}$) in FIG. 6 that are generated for the 3-bit DPA. FIG. 6 also shows a series transmission line 601 and a shunt transmission line 602 between the output network and each transistor ($Q_{1-3}$) of each Amplifier. Lines 602 are all about a quarter wavelength and terminate the second harmonic as well as supply current to their respective amplifier. Lines 601 are for matching purposes. During the design stage the optimiser can tune all six of these lines, resulting the differences between the lines.

Figure 7:
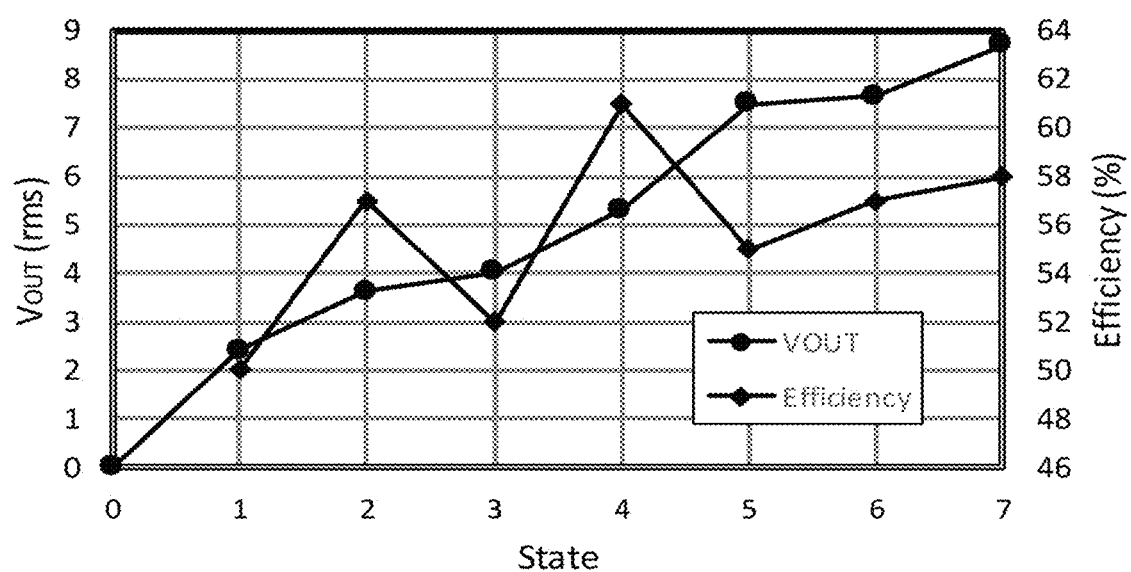
FIG. 7 shows simulation results of efficiency and output voltage for each $P_{OUT}$ state of a Digital Power Amplifier (DPA) with a hybrid combiner.

FIG. 7 shows simulation results of efficiency and output voltage for each $P_{OUT}$ state of a DPA with a hybrid combiner. FIG. 7 shows that by carefully optimising the transmission lines of the hybrid coupler it is possible to achieve seven unique active states that each have a high efficiency (i.e. greater than 50%) associated with them.

In the embodiment of FIG. 3, the active elements of each amplifier (i.e. the transistors) switch on and off in response to the input data signal ($D_{1-3}$). This generates a course output signal which is non-linear as indicated by the steps in the envelope of the output signal in FIG. 3.

Figure 8:
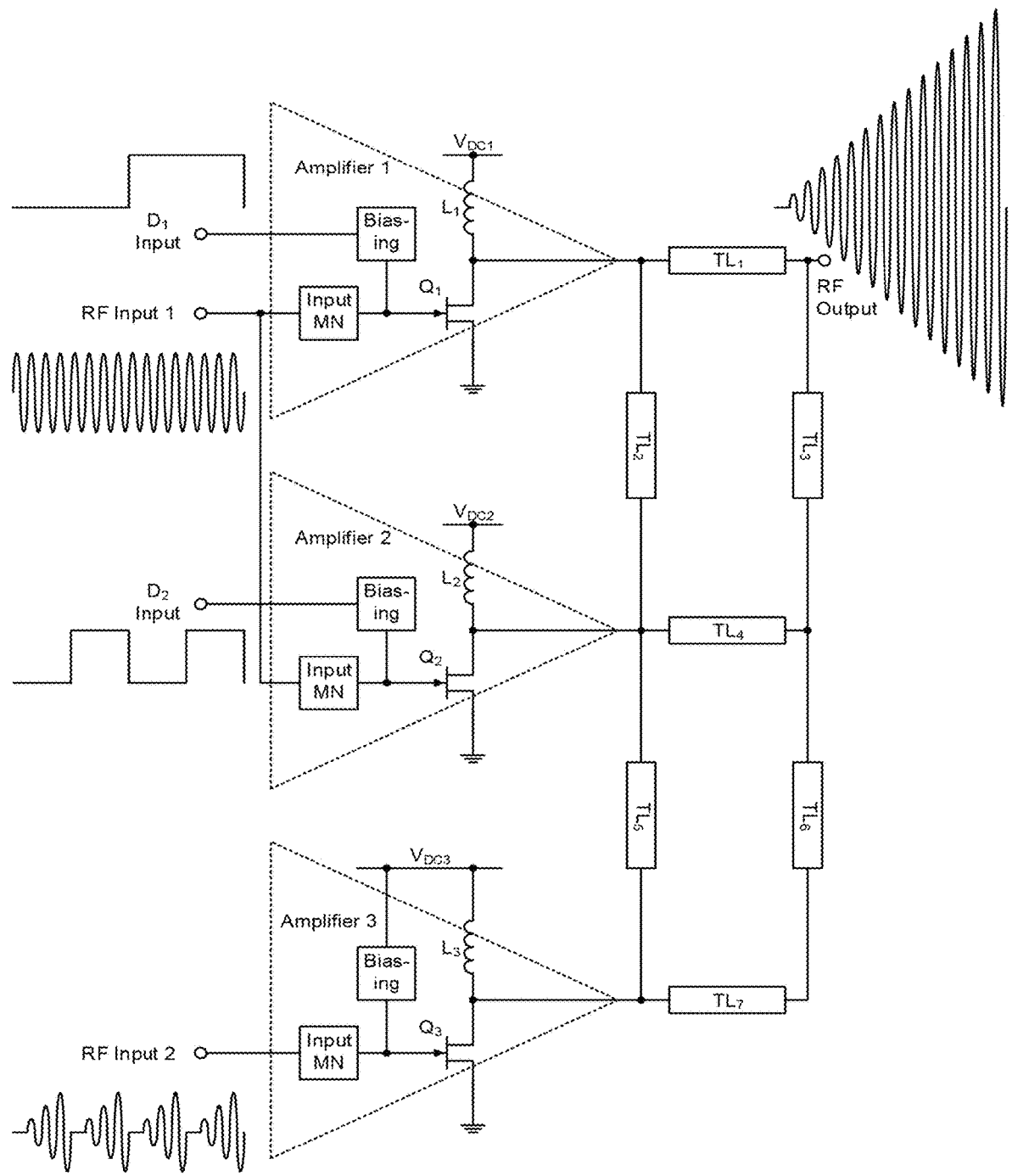
FIG. 8 shows a Digital Power Amplifier (DPA) comprising a linear amplifier according to an embodiment.

FIG. 8 shows a DPA comprising a linear amplifier according to an embodiment. FIG. 8 shows a DPA where the least significant amplifier (i.e. Amplifier 3) is a linear amplifier. In the embodiment of FIG. 8 the linear amplifier (Amplifier 3) is fed by a separate signal RF input 2 which is a linearly modulated signal containing both phase and amplitude information. The amplitude information can be viewed as the difference coarse output produced by Amplifier 1 and Amplifier 2, and the desired linear output. This amplifier, in effect fills in the gaps in the output RF voltage and maintains a linear output voltage between active states as shown by the varying envelope of the output in FIG. 8.

As far as is known, the embodiments presented herein are the only scalable DPAs that exploit load modulation. Embodiments moreover differ from known analogue load modulating amplifiers in that the amplifiers of the DPAs of the embodiment experience load modulation whenever more than one amplifier is in operation. In Doherty amplifiers in contrast the peaking amplifier only load modulates the carrier amplifier in the region of the amplitude peaks. In Outphasing amplifiers both amplifiers experience an equal amount of load modulation at back-off. Furthermore, the embodiment of FIG. 3 has the further advantage that it is highly scalable for realising DPAs with high resolution.

Embodiments are specifically designed for a high $P_{OUT}$ using discrete devices (as opposed to low power CMOS integration), for applications like TV broadcast transmitters. Furthermore the embodiments describe above can be realised using transmission line architectures, implementing power amplifiers in this way lends itself well to high power implementations since losses are low and heat can be easily dissipated.

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A digital power amplifier comprising:
   at least two individually activatable amplifiers coupled to an output network comprising a first hybrid coupler wherein:
   an output of a first amplifier is coupled to a first input of the first hybrid coupler; and
   an output of a second amplifier is coupled to a second input of the first hybrid coupler such that:
   activating an amplifier of the at least two amplifiers causes the amplifier to load modulate another activated amplifier of the at least two amplifiers,
   wherein a shortest connection between an output of the digital power amplifier and the first amplifier comprises a single transmission line of the first hybrid coupler,
   wherein the output network comprises a second hybrid coupler and wherein:
   the second amplifier is coupled to a first input of the second hybrid coupler; and
   a third amplifier is coupled to a second input of the second hybrid coupler; wherein:
   the first hybrid coupler and the second hybrid coupler have a common element and the first input of the second hybrid coupler is the same as the second input of the first hybrid coupler,
   wherein the digital power amplifier is configured to receive digital signals for invidually activating and deactivating the two or more amplifiers, the signals being individually applied as gate bias to transistors of the amplifiers, and the digital signals representing a binary number.

2. The digital power amplifier according to claim 1, wherein the first hybrid coupler comprises four transmission lines, the second hybrid coupler comprises four transmission lines, and impedances of the transmission lines are different from impedances of a classic hybrid coupler, the classic hybrid coupler including four transmission lines which are each a quarter of a wavelength, two of the four transmission lines in the classic hybrid coupler having each an impedance equal to a characteristic impedance, the other two transmission lines in the classic hybrid coupler having each an impedance equal to the characteristic impedance divided by a number.

3. The digital power amplifier according to claim 2, wherein the impedances of transmission lines in transmission line network are selected so that the impedance presented to a first activated amplifier by a combination of the output network and any other activated amplifiers sets output power of the first activated amplifier so that the first activated amplifier operates in saturation.

4. A digital power amplifier comprising:
at least two individually activatable amplifiers coupled to an output network comprising a first hybrid coupler wherein:
an output of a first amplifier is coupled to a first input of the first hybrid coupler; and
an output of a second amplifier is coupled to a second input of the first hybrid coupler such that:
activating an amplifier of the at least two amplifiers causes the amplifier to load modulate another activated amplifier of at least two amplifiers,
wherein a shortest connection between an output of the digital power amplifier and the first amplifier comprises a single transmission line of the first hybrid coupler,
wherein output power of an amplifier depends on a number of parallel hybrid couplers between the output of the amplifier and the output of the digital power amplifier,
wherein the amplifier with the shortest connection to the output is configured to provide the largest output power, and
wherein an amplifier separated from the output of the digital power amplifier by a largest number of hybrid couplers is configured to provide a smallest output power.

5. The digital power amplifier according to claim 4, wherein the digital power amplifier has a number of output power states equal to 2 raised to the $N^{th}$ power, where N equals a number of amplifiers in the at least two amplifiers.

6. The digital power amplifier according to claim 5, wherein the at least two amplifiers are enabled and disabled in sequence to produce the 2 raised to $N^{th}$ power output power states.

7. The digital power amplifier according to claim 1, wherein the first amplifier is configured to receive a digital signal of the digital signals and a radio frequency signal, and the second amplifier is configured to receive a digital signal of the digital signals and a radio frequency signal.

8. The digital power amplifier according to claim 1, wherein the digital signal at the input to the first amplifier is the most significant bit of the binary number.

9. The digital power amplifier of claim 1, wherein an amplifier of the at least two amplifiers includes a series transmission line and a shunt transmission line between the output of the amplifier and the output network.

10. The digital power amplifier according to claim 1, wherein an amplifier of the at least two amplifiers has a supply voltage that is different to another amplifier in the at least two amplifiers.

11. The digital power amplifier according to claim 1, wherein the two or more amplifiers and their connections are configured to provide output power levels in saturation optimised for a predetermined signal modulation scheme.

12. A digital power amplifier comprising:
at least two individually activatable amplifiers coupled to an output network comprising a first hybrid coupler wherein:
an output of a first amplifier is coupled to a first input of the first hybrid coupler; and
an output of a second amplifier is coupled to a second input of the first hybrid coupler such that:
activating an amplifier of the at least two amplifiers causes the amplifier to load modulate another activated amplifier of at least two amplifiers,
wherein an amplifier separated from the output of the digital power amplifier by the greatest number of hybrid couplers is a linear amplifier.

13. The digital power amplifier according to claim 1, wherein the digital power amplifier applies pre-distortion to the input of the amplifier.

14. A device comprising the digital power amplifier according to claim 1, wherein the device is a mobile phone base station or a DVB transmitter.

15. A digital power amplifier comprising:
at least two individually activatable amplifiers coupled to an output network comprising a first hybrid coupler wherein:
an output of a first amplifier is coupled to a first input of the first hybrid coupler; and
an output of a second amplifier is coupled to a second input of the first hybrid coupler such that:
activating an amplifier of the at least two amplifiers causes the amplifier to load modulate another activated amplifier of the at least two amplifiers,
wherein a shortest connection between an output of the digital power amplifier and the first amplifier comprises a single transmission line of the first hybrid coupler,
wherein the output network comprises a second hybrid coupler and wherein:
the second amplifier is coupled to a first input of the second hybrid coupler; and
a third amplifier is coupled to a second input of the second hybrid coupler; wherein:
the first hybrid coupler and the second hybrid coupler have a common element and the first input of the second hybrid coupler is the same as the second input of the first hybrid coupler,
wherein the first hybrid coupler includes four transmission lines, the second hybrid coupler includes four transmission lines, and impedances of the transmission lines are different from impedances of a classic hybrid coupler, the classic hybrid coupler including four transmission lines which are each a quarter of a wavelength, two of the four transmission lines in the classic hybrid coupler having each an impedance equal to a characteristic impedance, the other two transmission lines in the classic hybrid coupler having each an impedance equal to the characteristic impedance divided by a number.

* * * * *